United States Patent [19]

Horiike et al.

[11] Patent Number: 5,487,785
[45] Date of Patent: Jan. 30, 1996

[54] PLASMA TREATMENT APPARATUS

[75] Inventors: Yasuhiro Horiike, Hiroshima; Takayuki Fukasawa, Yamanashi, both of Japan

[73] Assignee: Tokyo Electron Kabushiki Kaisha, Tokyo, Japan

[21] Appl. No.: 233,591

[22] Filed: Mar. 25, 1994

[30] Foreign Application Priority Data

Mar. 26, 1993 [JP] Japan .................................. 5-092303
Mar. 26, 1993 [JP] Japan .................................. 5-092304

[51] Int. Cl.$^6$ .................................................. C23C 16/00
[52] U.S. Cl. .................... 118/723 E; 118/723 MR; 118/723 MP; 204/298.37; 204/298.07; 204/298.16
[58] Field of Search ............... 118/723 E, 723 ER, 118/723 MW, 723 MA, 723 MR, 723 MP, 345; 204/298.16, 298.17, 298.18, 298.19, 298.2, 298.21, 298.22, 298.37, 298.07

[56] References Cited

U.S. PATENT DOCUMENTS

| | | | |
|---|---|---|---|
| 5,000,113 | 3/1991 | Wang | 118/723 |
| 5,122,251 | 6/1992 | Campbell | 204/298.06 |
| 5,134,965 | 8/1992 | Tokuda | 118/723 |
| 5,173,641 | 12/1992 | Imahashi | 315/111.41 |
| 5,254,171 | 10/1993 | Hayakawa | 118/723 MR |

Primary Examiner—R. Bruce Breneman
Assistant Examiner—Joni Y. Chang
Attorney, Agent, or Firm—Beveridge, DeGrandi, Weilacher & Young

[57] ABSTRACT

A semiconductor wafer plasma treatment apparatus comprising a processing vessel whose interior is maintained at a predetermined degree of vacuum; a plasma generation means which is arranged on an upper surface of the processing vessel and generates radio-frequency waves into the interior thereof, to cause the generation of a plasma in the process gas within the processing vessel; and a holder for holding a semiconductor wafer that is to be subjected to a predetermined treatment by the plasma generated from the process gas by the action of the plasma generation means, a supply means which supplies process gas into the processing vessel comprises first gas supply pipes that are arranged at positions equidistant in the peripheral direction around the processing vessel and a second gas supply pipe that is arranged at the center of an upper surface of the processing vessel, and gas exhaust means from exhaust gases from the processing vessel is arranged at positions equidistant in the peripheral direction around the processing vessel. This configuration counters any drop in the plasma density at the central portion of the processing vessel to obtain a uniformly high-density plasma, making it possible to subject large-diameter semiconductor wafers to uniform, rapid treatment.

20 Claims, 7 Drawing Sheets

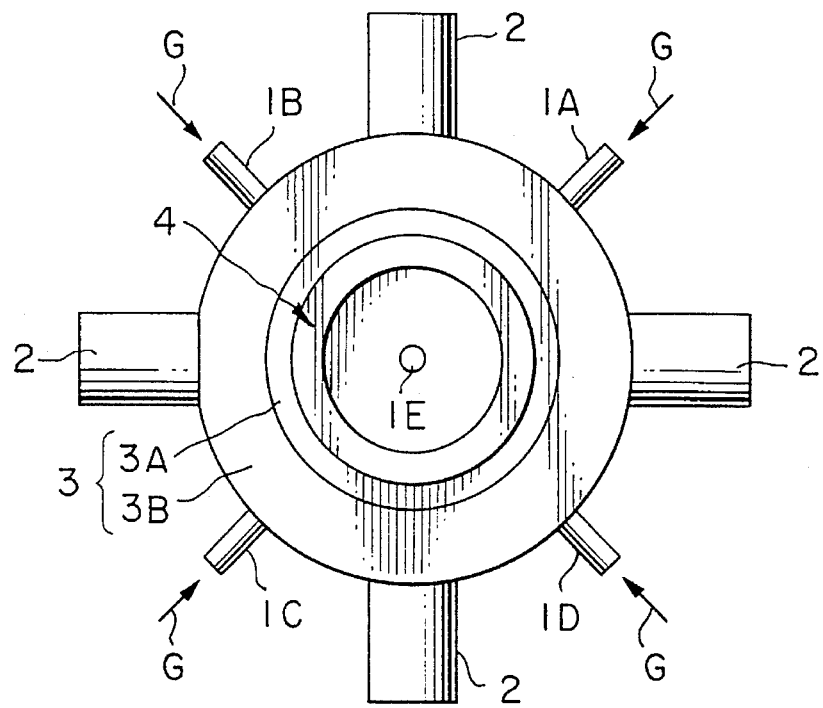
F I G. 1
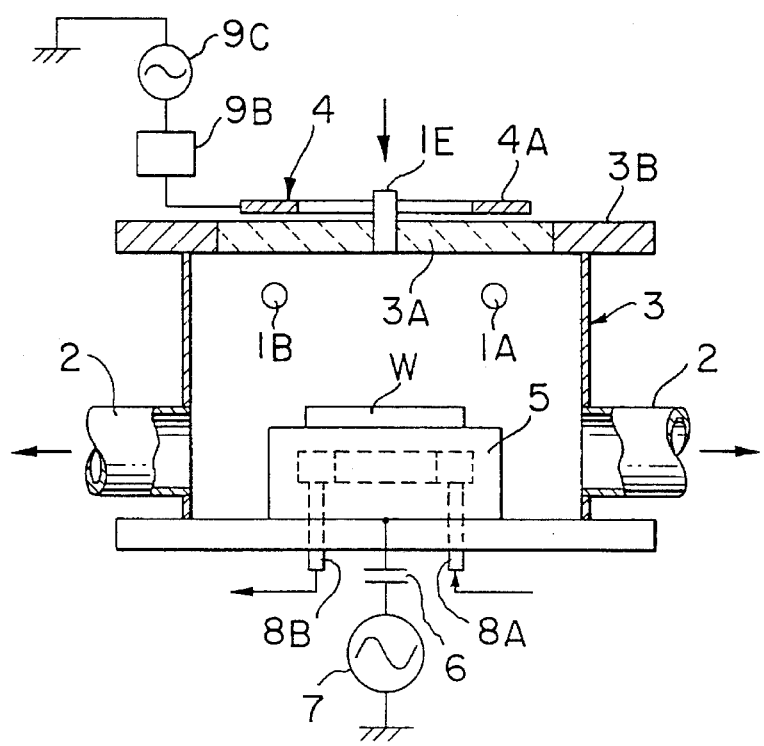
F I G. 2

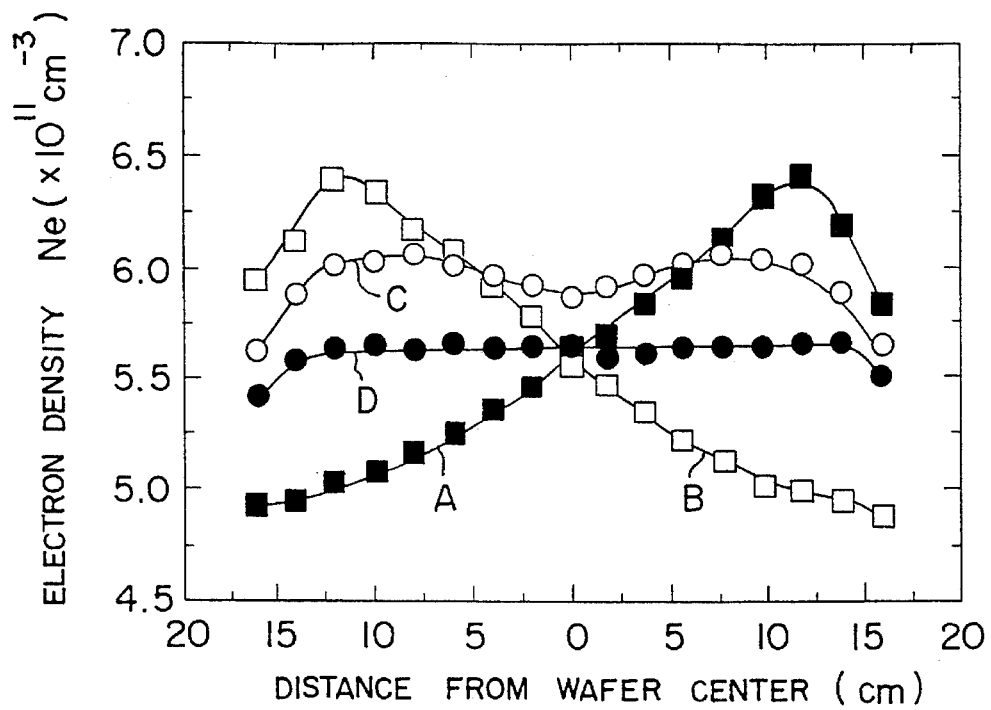
F I G. 3
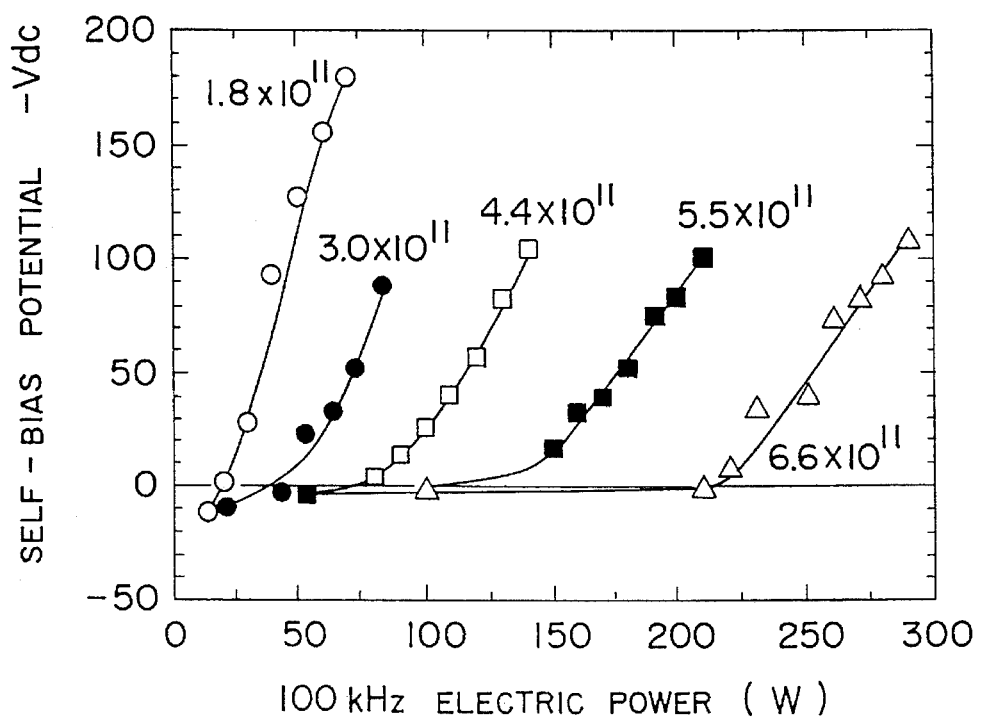
F I G. 4

PLASMA TREATMENT APPARATUS

BACKGROUND OF THE INVENTION

1. Field of the Invention

The present invention relates to a plasma processing or treatment apparatus for an object such as a semiconductor wafer.

2. Related Art

A plasma processing or treatment apparatus is configured such that a plasma is generated by vacuum-charging the interior of a processing vessel in which exists a processing gas, and that plasma is used to implement a predetermined treatment on an object such as a semiconductor wafer. In the prior art, such plasma treatment apparatuses are widely used throughout the semiconductor fabrication process, in steps such as in sputtering, ashing, CVD, and etching.

In a typical plasma treatment apparatus, a pair of horizontal, flat electrodes that face each other act as the plasma generation source. In this type of apparatus, the relationship of the electrode configuration means that a comparatively high gas pressure of, for example, several hundreds of mmTorr is used, and thus problems can occur such as ions within the plasma impacting against the electrodes and causing sputtering of the electrodes, which will lead to impurities being generated from the electrodes. For that reason, this type of apparatus is difficult to adapt to cope with recent ultra-fine processing techniques at a half-micron and greater. That is why various plasma treatment apparatuses are currently being developed to generate high-density plasmas under hard vacuum conditions. Examples of these plasma treatment apparatuses include a magnetron style that uses orthogonal electromagnetic fields, a radio-frequency inductively coupled style that uses radio-frequency electromagnetic energy, and, most recently, an apparatus that uses helicon, or helical waves generated from electromagnetic waves propagated parallel to a magnetic field.

A radio-frequency inductively coupled type of plasma treatment apparatus is provided with: a processing vessel that has a gas supply portion for supplying a processing gas and a gas exhaust portion for exhausting the gas after the treatment, and which maintains a predetermined degree of vacuum therein; a plasma generation means arranged on an upper surface of the processing vessel; and a holder device that holds a semiconductor wafer on which a predetermined treatment is to be performed in a plasma produced by the plasma generation means. The processing vessel is provided with a main body formed from an electrically conductive material such as stainless steel, with an upper portion formed from an insulating material that is transparent to radio-frequency waves, such as quartz, mounted on an upper end of the main body. Each of the above mentioned gas supply portion and gas exhaust portion is attached to the peripheral surface of the main body. The plasma generation means is provided with, for example, a one-turn antenna and a radio-frequency power source connected to this antenna by a matching circuit, with the configuration being such that radio-frequency electric power from the radio-frequency power source is supplied to the antenna through the matching circuit, radio-frequency waves are generated within the processing vessel from the antenna, and the process gas is activated by this electromagnetic energy to cause the generation of a plasma. The holder device is configured such that another radio-frequency power source is connected thereto with a blocking capacitor therebetween, radio-frequency electric power is supplied from this radio-frequency power source, and a self-bias potential is maintained with respect to the plasma's potential, via the blocking capacitor. When the above mentioned plasma treatment apparatus is used to physically etch a semiconductor wafer using argon, the pressure of the argon within the processing vessel is first adjusted to 10 mmTorr, with the semiconductor wafer held on the holder device. Next, when predetermined electric power from the radio-frequency power source is supplied to the antenna via the matching circuit, radio-frequency waves are generated within the processing vessel from the antenna, this electromagnetic energy excites the argon to form a plasma, and thus a high-density plasma of, for example, the order of $10^{11}$ cm$^{-3}$ is generated. At the same time, since 100-kHz radio-frequency electric power is supplied through the blocking capacitor from the radio-frequency power source in the holder device, an ion sheath is formed between the holder device and the plasma, and argon ions from the plasma impact against the semiconductor wafer to perform the predetermined etching.

The previously mentioned prior art helical wave plasma treatment apparatus is provided with: a processing vessel having a gas supply means for supplying a process gas and a gas exhaust means for exhausting gases after the treatment, and is maintained at a predetermined degree of vacuum; a helical wave plasma generation means that surrounds an application portion forming part of the processing vessel; and a holder device for holding a semiconductor wafer that is to be subjected to a predetermined treatment by the helical wave plasma generated from the process gas by the action of the helical wave plasma generation means. This application portion is formed of an insulating material that is transparent to electromagnetic waves, such as quartz, and the above described main body connected to a lower end aperture of the application portion is formed of an electrically conductive material such as stainless steel. The helical wave plasma generation means is also provided with an antenna surrounding the outer peripheral surface of the application portion and an electromagnetic coil also surrounding the application portion, but further out from the antenna. The configuration is such that electromagnetic waves from the antenna propagate parallel to the magnetic field shaped by the electromagnetic coil; the electromagnetic waves are subjected to the action of the magnetic field as they propagate through the plasma, and thus generate helical waves; and a high-density helicon wave plasma is generated by these helical waves.

When this helicon wave plasma treatment apparatus is being used to physically etch a semiconductor wafer using argon, argon is first supplied from the gas supply means into the processing vessel and its pressure is adjusted to 10 mmTorr, with the semiconductor wafer held on the holder device. In this state, radio-frequency electric power is applied to the antenna, the generation of electromagnetic waves proceeding from the antenna in the axial direction within the processing vessel causes electrons to absorb energy from these electromagnetic waves, these electrons collide with the argon gas, ionizable energy is imparted to the argon atoms, and this generates the high-density plasma. At the same time, a magnetic field is shaped parallel to the direction of progress of the electromagnetic waves within the processing vessel by the electromagnetic coil. Thus, low-frequency helical waves from the electromagnetic waves are propagated through the plasma by the action of this magnetic field, and, during this time, the electrons within the plasm are accelerated to increase the density of the plasma. At the same time, radio-frequency electric power is supplied via the blocking capacitor by the radio-frequency power source of the holder device, so that the holder device becomes self-biased as described above, and the potential difference with respect to the plasma's potential causes argon ions to impact against the semiconductor wafer so that the semiconductor wafer is etched thereby. Since this plasma treatment can be implemented by causing the generation of helical waves within even a comparatively weak magnetic field, it is possible to soften the effects of the magnetic field in comparison with electronic cyclotron resonance (ECR) plasma treatment that uses a strong magnetic field.

A high-density plasma of the order of $10^{11}$ cm$^{-3}$ can be obtained with the above described prior art plasma treatment apparatus that uses inductively coupled radio-frequency waves, but if an attempt is made to increase the power supplied to the antenna to further increase the density of the plasma (for example, if the supplied power is increased to 600 W), the plasma density does become approximately uniform within a central portion within a radius of 50 mm from the center of the processing vessel, but as the power is increased further to 800 W and then 1 kW to increase the plasma density even further, as will be shown later in a graph, the plasma density in the central portion drops, there is an increasing tendency for the plasma density to increase with distance from the center in a certain direction, and thus it becomes more difficult to obtain an uniform high-density plasma as the plasma density increases, raising concern that it is becoming more difficult to implement uniform plasma treatment. This tendency becomes more and more obvious as the diameters of semiconductor wafers increase, and it is becoming a big problem concerning plasma treatment as diameters become increasingly larger in the future.

If the plasma densities obtained by plasma treatment apparatuses are up to the order of $10^{11}$ cm$^{-3}$, a self-bias potential of several tens of volts to several hundred volts can be obtained by just the application of power of several tens of Watts to the holder device, but when it comes to the above described higher plasma densities of the order or $10^{11}$ cm$^{-3}$ or higher, conventional radio-frequency bias circuitry cannot achieve a self-bias potential of about several tens of watts, even if power is supplied at several hundred watts, so that concern has been raised that it has become impossible to implement such plasma treatment.

Further, when a prior art helical wave plasma treatment apparatus is used, plasma treatment can be implemented even with an ECR plasma in a weak magnetic field. However, if, for example, the magnetic field is further weakened in order to lessen the effects of the magnetic field, etching rates gradually decrease with distance from the antenna, etching at the central portion of the semiconductor wafer is delayed the most, and thus a problem occurs in that it becomes difficult to implement uniform etching (plasma treatment) over the entire surface. In general, trends such as the recent increase in diameter of semiconductor wafers are becoming more obvious, and film thicknesses have also become even thinner. Therefore it is becoming impossible to use a prior art helicon wave plasma treatment apparatus to treat objects under weak magnetic field conditions.

If etching of a semiconductor wafer is done using a high-density plasma with a prior art helical wave plasma treatment apparatus, there is a problem in that only the peripheral parts of the semiconductor wafer that are outside a high-density region of the plasma are etched, virtually no etching occurs in the central portion within this region, and also there is a problem that the etching rate is not constant over all positions on of the semiconductor wafer.

SUMMARY OF THE INVENTION

The present invention was devised in order to solve the above described problems and has as its object the provision of a plasma treatment apparatus that creates a uniform high-density plasma wherein the plasma density does not drop at the central portion of the processing vessel, to enable uniform, rapid processing of a large-diameter object.

A further object of the present invention is to provide a plasma treatment apparatus that causes the generation of helical waves under weak magnetic field conditions, to create a uniform high-density plasma throughout and thus enable uniform, rapid processing of a large-diameter object.

A yet further object of the present invention is to provide a plasma treatment apparatus that can sufficiently ensure and maintain a self-bias potential at a low level of supplied power, even in a high-density plasma on the order of $10^{11}$ cm$^{-3}$.

A still further object of the present invention is to provide a plasma treatment apparatus that can perform uniform, rapid treatment throughout, even for the treatment of a large-diameter object, by using a helical wave plasma.

To achieve the above objectives, the present invention provides a plasma treatment apparatus comprising: a processing vessel capable of being maintained at a predetermined degree of vacuum; gas supply means for supplying a process gas into the processing vessel; gas exhaust means for exhausting gases from within the processing vessel after treatment is completed; plasma generation means provided in the processing vessel, to generate radio-frequency waves within the processing vessel to cause generation of a plasma in the process gas; and holder means provided in the processing vessel to hold an object to be subjected to a predetermined treatment by the plasma. The gas supply means comprises: a plurality of first gas supply means arranged equidistantly in the peripheral direction around the processing vessel; and second gas supply means arranged at the center of an upper surface of the processing vessel. The gas exhaust means comprises a plurality of gas exhaust means arranged equidistantly in the peripheral direction around the processing vessel.

In this plasma treatment apparatus, the holder means is provided with a capacitor that maintains a bias potential, and this capacitor has a capacitance that is at least 10 times that of an ion sheath formed in the vicinity of the holder means.

The present invention also provides a plasma treatment apparatus comprising: a processing vessel capable of being maintained at a predetermined degree of vacuum; gas supply means for supplying a process gas into the processing vessel; gas exhaust means for exhausting gases from within the processing vessel after treatment is completed; an application portion provided in an upper portion of the processing vessel; helical wave plasma generation means provided surrounding the application portion and causing the generation of a helical wave plasma within the processing vessel; holder means provided within the processing vessel to hold an object to be subjected to a predetermined treatment by the helical wave plasma; and second plasma generation means provided above the application portion, to generate radio-frequency waves toward the interior of the application portion and thus increase the density of the plasma.

The present invention still further provides a plasma treatment apparatus comprising: a processing vessel capable of being maintained at a predetermined degree of vacuum; gas supply means for supplying a process gas into the processing vessel; gas exhaust means for exhausting gases from within the processing vessel after treatment is completed; holder means for holding an object in the treatment vessel; and helical plasma generation means provided in a side portion of the processing vessel in such a manner as to cause a helical wave plasma to be generated within the process gas, in a flat plate-shaped region interposed within a gap with respect to an object held on the holder means. The helical plasma generation means comprises: an electromagnetic wave generation means for generating electromagnetic waves parallel to the object on the holder means; and a rectangular magnetic field shaping means for shaping a rectangular magnetic field in the same direction as the electromagnetic waves from the electromagnetic wave generation means, to cause the generation of a helical wave plasma from the electromagnetic waves.

Preferred embodiments of the present invention will be described in more detail below, with reference to the accompanying drawings.

BRIEF DESCRIPTION OF THE DRAWINGS

FIG. 1 is a plan view of a radio-frequency inductively coupled type of plasma treatment apparatus in accordance with one embodiment of the present invention;

FIG. 2 is a vertical section through the plasma treatment apparatus of FIG. 1;

FIG. 3 is a graph evaluating the effects on plasma density within the processing vessel of using different methods to supply the process gas from a first gas supply portion of the plasma treatment apparatus of FIG. 1;

FIG. 4 is a graph of the relationship between the electric power applied to the holder device of the plasma treatment apparatus of FIG. 1 and the self-bias potential;

DESCRIPTION OF THE PREFERRED EMBODIMENTS

Figure 5:
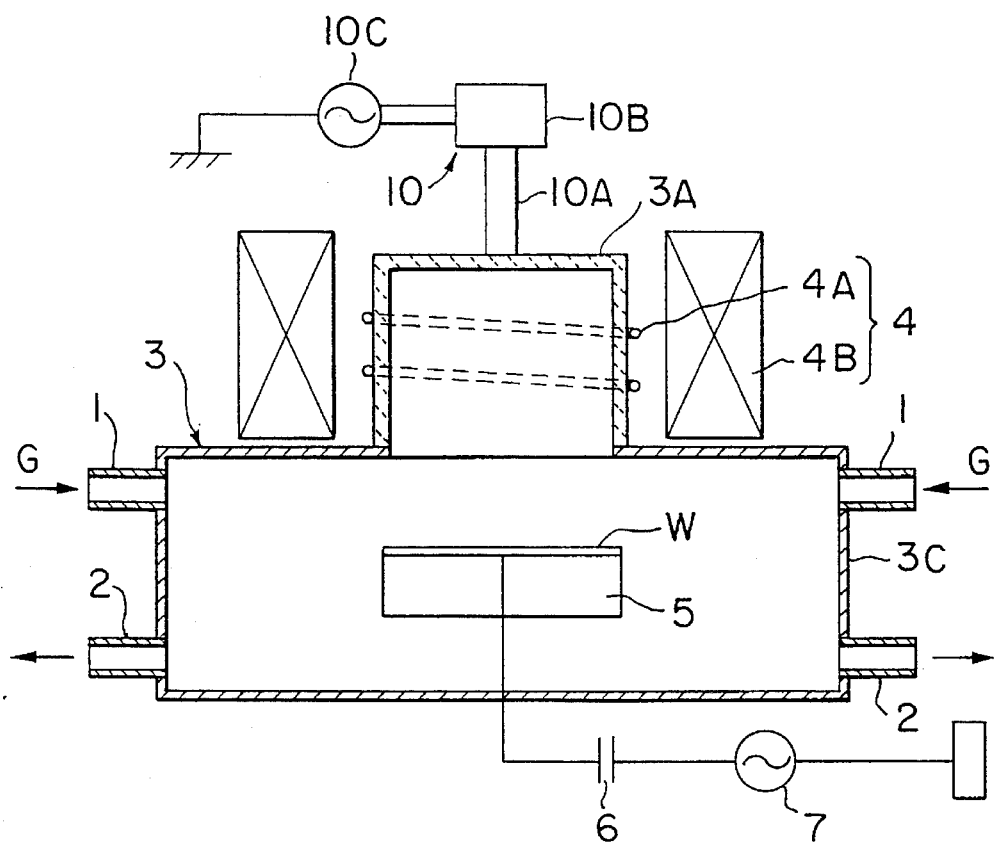
FIG. 5 is a vertical section through a helical wave plasma treatment apparatus of another embodiment of the present invention.

An embodiment of a radio-frequency inductively coupled type of plasma treatment apparatus in accordance with the present invention is shown in FIGS. 1 and 2. As shown in the plan view of FIG. 1, this plasma treatment apparatus has a processing vessel 3, with first gas supply pipes 1A, 1B, 1C, and 1D for supplying a process gas G into the processing vessel 3 being provided in a radial fashion at constant peripheral spacing at a plurality of places (four in the example shown in these figures) around the outer periphery of the processing vessel 3. As can be seen from FIG. 2, the first gas supply pipes 1A to 1D are provided toward the upper end of the processing vessel 3. Gas exhaust structures, e.g. pipes 2 for exhausting gases from the interior of the processing vessel 3 are also provided at constant peripheral spacing at a plurality of places (four in the example shown in these figures) around the outer periphery of the processing vessel 3. As shown in FIG. 2, the gas exhaust pipes 2 are provided toward the lower end of the processing vessel 3, and the positions of the gas exhaust pipes 2 in the peripheral direction around the processing vessel 3 are such that each one is between neighboring first gas supply pipes 1A, 1B, 1C, and 1D, as shown in FIG. 1.

A plasma generation device 4 for generating radio-frequency within the processing vessel 3 to cause the generation of a high-density plasma in the process gas G is provided above the processing vessel 3. A known holder device 5 for holding on the upper surface thereof a semiconductor wafer W as an object to be treated is provided in the interior of the processing vessel 3. The holder device 5 is connected to a radio-frequency power source 7 with a blocking capacitor 6 therebetween, in such a manner that a radio-frequency voltage is applied to the holder device 5. A coolant supply pipe 8A that supplies a coolant into the interior of the holder device 5 to cool it in a known manner is connected to the holder device 5, and a coolant exhaust pipe 8B for exhausting the coolant after this cooling is also provided.

The plasma generation device 4 has a one-turn loop antenna 4A of a configuration such that it generates radio-frequency waves in the process gas G within the processing vessel 3 by the action of a matching circuit 9B and a radio-frequency power source 9C of known types that are connected to the antenna, and the electromagnetic energy of these radio-frequency waves turn the process gas G into a plasma to generate a high-density plasma of the order of $10^{11}$ cm$^{-3}$. All of the first gas supply pipes 1A to 1D, gas exhaust pipes 2, processing vessel 3, and holder device 5 are formed of an electrically conductive material such as stainless steel, a central portion 3A of an upper surface of the processing vessel 3 at which the loop antenna 4A is arranged is formed of an insulating material such as quartz or alumina, and a peripheral portion 3B thereof is formed of the same electrically conductive material as the processing vessel 3.

In addition to the first gas supply pipes 1A to 1D, a second gas supply pipe 1E is arranged at a place in the center of the upper surface of the processing vessel 3 as another gas supply means, so that process gas G can be supplied uniformly within the processing vessel 3 by this second gas supply pipe 1E and the radially arranged first gas supply pipes 1A to 1D. The gas exhaust pipes 2 are arranged equidistantly along the periphery of the lower peripheral surface of the processing vessel 3, so that the product gases within the processing vessel 3 after the treatment can be exhausted through all these gas exhaust pipes 2 to the exterior without any unevenness.

The present inventors measured the distribution of electron density Ne generated within the processing vessel 3 when the process gas G was supplied from the gas supply pipes 1A to 1E by different methods. The results of these measurements are shown in FIG. 3. For example, a distribution curve A in this figure was obtained as the results of supplying process gas G by opening only the first gas supply pipe 1A, leaving all of the other first gas supply pipes 1B to 1D and the second gas supply pipe 1E closed, then measuring the electron density Ne in the diametric direction across the processing vessel 3 from the first gas supply pipe 1C to the first gas supply pipe 1A. It can be seen from curve A that the electron density Ne is at a maximum in the vicinity of the first gas supply pipe 1A and gradually decreases with distance from the first gas supply pipe 1A.

The first gas supply pipe 1B was then opened alone, process gas G was supplied with all of the other first gas supply pipes and the second gas supply pipe 1E being closed, and a distribution curve B was obtained as the results of measuring the electron density Ne in the diametric direction across the processing vessel 3 from the first gas supply pipe 1B to the first gas supply pipe 1D. It can be seen from curve B that the electron density Ne is at a maximum in the vicinity of the first gas supply pipe 1B and gradually decreases with distance from the first gas supply pipe 1B, in a similar manner to that described above.

The second gas supply pipe 1E alone was then closed, with all of the first gas supply pipes 1A to 1D being open, and a distribution curve C was obtained as the results of measuring the electron density Ne in the diametric direction across the processing vessel 3 from the first gas supply pipe 1B to the first gas supply pipe 1D. It can be seen from curve C that the electron density Ne is somewhat lower at the periphery than at the central portion of the processing vessel 3, so that a uniform electron density Ne can not be obtained by simply supplying the process gas G radially from positions that are equidistantly spaced around the processing vessel 3.

Next, the process gas G was supplied from all of the gas supply pipes 1A to 1E and a distribution curve D was obtained thereby, from which it can be seen that the electron density Ne within the processing vessel 3 can be made approximately uniform. From the above results, it is clear that supplying the process gas G uniformly from the periphery and upper surface of the processing vessel 3 enables a uniform electron density Ne within the processing vessel 3, which means that a uniform high-density plasma can be achieved. In contrast, if the supply of process gas G is unbalanced, as it is in the radio-frequency inductively-coupled plasma treatment apparatus of the prior art, even if various techniques are devoted to the plasma generation means, the electron density Ne will be lower at the central portion, and rise toward the left side as seen in FIG. 9, so it is clear that there is a limit to the uniformity of the electron density.

The present invention provides uniform supply of the process gas G from around the periphery of the processing vessel 3 by the first gas supply pipes 1A to 1D, and also provides a downward supply of the process gas G from the center of the top surface of the processing vessel 3 by the second gas supply pipe 1E. Therefore, the supply of process gas G from above can compensate in portions where the process gas G supplied from the first gas supply pipes 1A to 1D cannot scatter sufficiently, the concentration of the process gas G within the processing vessel 3 can be rapidly made even, this enables the achievement of a uniform high-density plasma within the processing vessel 3, and thus treatment can be performed over the entire surface of the semiconductor wafer both uniformly and rapidly. In accordance with this embodiment of the present invention, since a one-turn loop antenna 4A is used as the plasma generation device 4, the second gas supply pipe 1E can be mounted in the central portion thereof so that uniform plasma treatment can be implemented without any drop in the plasma density at the center, even with a semiconductor wafer W of a larger diameter as described above.

Figure 9:
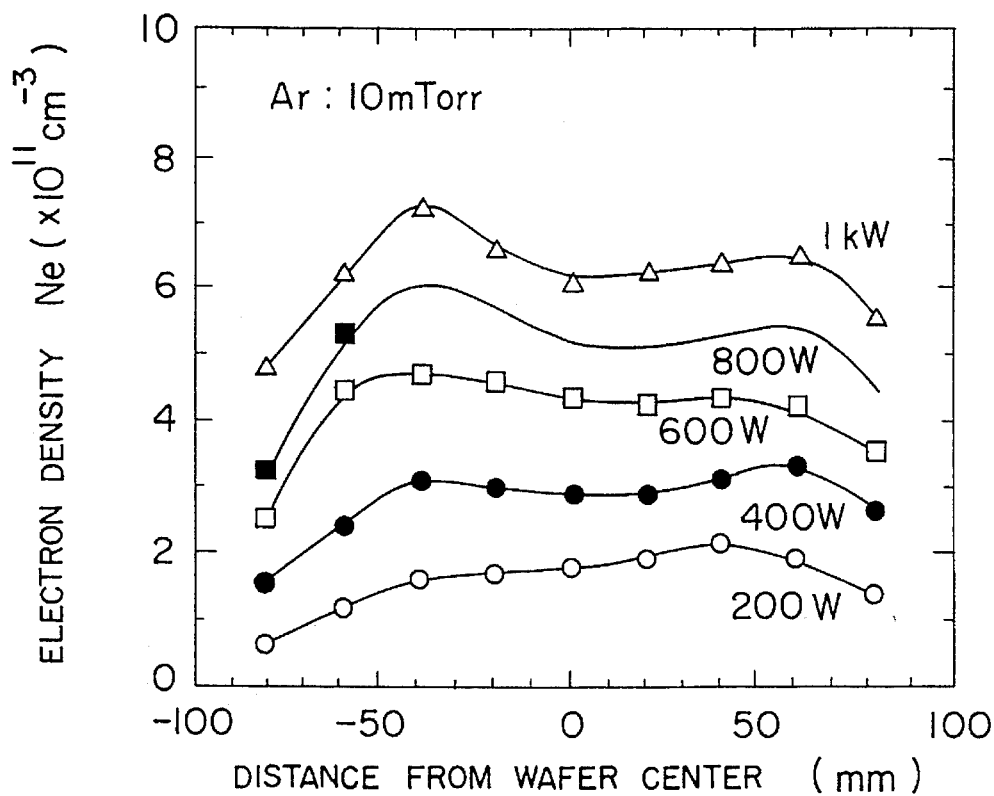
FIG. 9 is a graph showing the relationship between position in the radial direction on a semiconductor wafer and electron density in the plasma at that position, when the power applied to the antenna of a prior art radio-frequency inductively coupled type of plasma treatment apparatus is varied.

With the previously described radio-frequency inductively-coupled plasma treatment apparatus of the prior art, a high-density plasma of the order of $10^{11}$ cm$^{-3}$ can be obtained, as shown in FIG. 9, but if an attempt is made to obtain an even denser plasma by increasing the power supplied to the antenna 14A (for example, by increasing the power supplied further to 600 W), the plasma density will still be substantially uniform in a central portion within a radius of 50 mm from the center of the processing vessel, as shown in FIG. 9. However, as the supplied power is increased further to 800 W or 1 kW, it can be seen from this graph that the plasma density at the central portion will drop as the plasma density increases, and also the plasma in the leftward portion will tend to increase in particular, so there is the problem that it becomes more difficult to obtain a uniform high-density plasma as the density increases, and thus it is difficult to implement uniform plasma treatment. This tendency becomes more obvious as the diameters of the semiconductor wafers increase, which is making it a big problem for plasma treatment of even larger diameters in the future.

Figure 10:
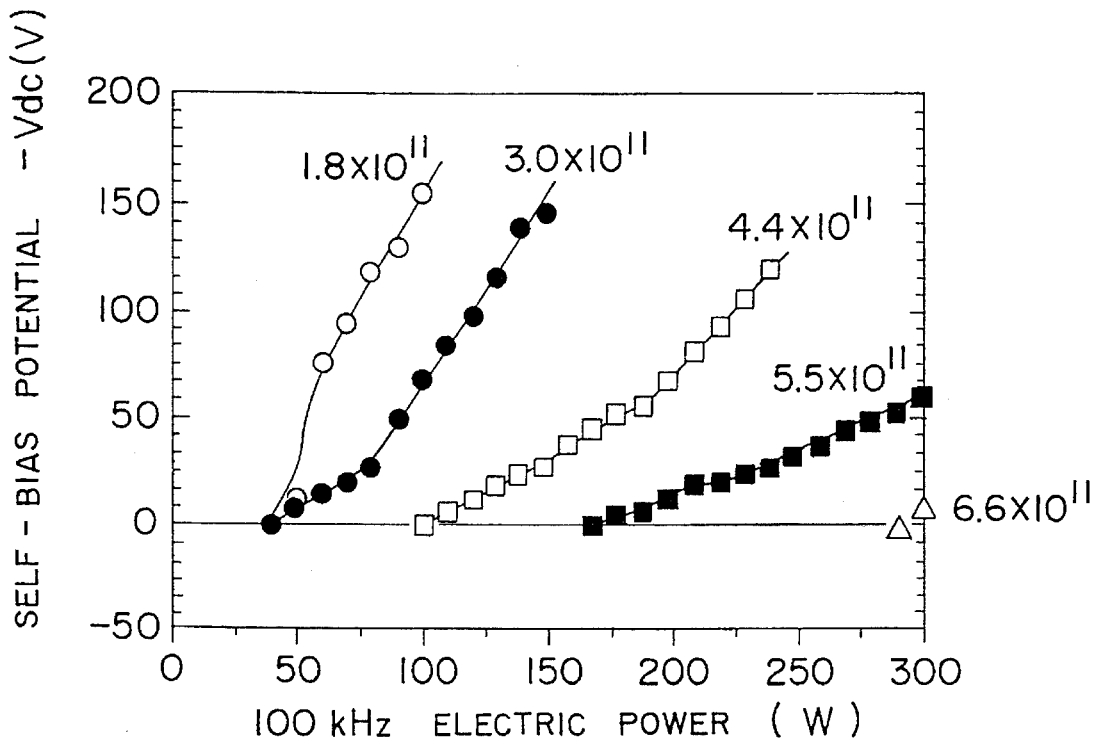
FIG. 10 is a graph of the relationship between electric power applied to a holder device and self-bias potential, in a prior art plasma treatment apparatus.

If the plasma density obtained by the plasma treatment apparatus is up to the order of $10^{11}$ cm$^{-3}$, the application of several tens of watts of electric power to the holder device 5 will achieve a self-bias potential -Vdc of several tens of volts to several hundred volts, but when the plasma density reaches the above described order of $10^{11}$ cm$^{31\ 3}$, a prior art radio-frequency bias circuit would only be able to achieve a self-bias potential -Vdc of about several tens of volts, even if power of several hundred watts is supplied, and thus there is the problem that plasma treatment becomes impossible. The relationship between supplied power and self-bias potential -Vdc is shown graphically in FIG. 10, and this relationship between the two factors will be described below with reference to this figure. It can be seen from this figure that, if the plasma density is of the order of $10^{11}$ cm$^{-3}$, it becomes increasingly difficult to achieve a self-bias potential at the holder device 5, even if the power supplied to the holder device 5 is increased, and when it exceeds $6.6 \times 10^{11}$ cm$^{-3}$, virtually no self-bias potential is created which is a problem in that treatment of the semiconductor wafer W cannot be done even if a high-density plasma could be obtained by some means. Note that the data shown in FIG. 10 refers to a self-bias potential -Vdc when different electric powers are supplied at 100 kHz when the capacitance of the blocking capacitor 6 is 3000 pF. This self-bias potential -Vdc was measured between the holder device 5 and the blocking capacitor 6.

To solve the above described problem, the capacitance of the blocking capacitor 6 is set to at least 10 times that of the ion sheath between the holder device 5 and the plasma, and is preferably set to at least 50 times that value, even more preferably to at least 100 times. A capacitance of less than 10 times that value raises concern in that it might not be possible to create the self-bias potential -Vdc necessary for plasma treatment, even with a large power for generating the high-density plasma of, for example, $10^{11}$ cm$^{-3}$. The relationship between supplied power (at 100 kHz) and self-bias potential -Vdc when the plasma density is varied as a parameter between 1.8 and $6.6 \times 10^{11}$ cm$^{-3}$, using a 25 000-pF blocking capacitor 6 is shown in FIG. 4. It is clear from this figure that a sufficient self-bias potential -Vdc can be obtained at a low power of several tens of watts when the plasma density is $1.8 \times 10^{11}$ cm$^{-3}$. As a result of calculating the capacitance of the ion sheath, we have determined that capacitance to be 637 pF. Therefore, the capacitance 25,000 pF of the blocking capacitor 6 is approximately 40 times that of the ion sheath. The capacitance of an ion sheath can be calculated using the following equation for obtaining the thickness of an ion sheath when general-purpose flat-plate electrodes are used:

$$0.97 = (y_p - \tfrac{1}{2})^{3/2}$$

where: $y_p = eV_p/\kappa T_e$ and $\eta = d/\lambda D$, $V_p$ is the electrode potential measured in the negative direction and based on the plasma potential, and $\lambda D = (E \kappa T_e / N e\, e^2)^{1/2}$ is the length of the device. Note that the capacitance of a prior art blocking capacitor is usually about 3000 pF.

If, for example, the above equation is used to calculate the capacitance of an ion sheath in argon for an electrode area (equivalent to the area of the upper surface of the holder device 5) of 314 cm$^2$ (for 8" wafers), a value of 3.85 nF is obtained. Note that the electron temperature Te is 3 eV. In this case, if the capacitance of the blocking capacitor 6 is set to 100 times that of the ion sheath, 385 nF, a sufficient self-bias potential can be ensured and maintained, even when the plasma density is of the order of $10^{11}$ cm$^{-3}$.

Therefore, in accordance with this embodiment, by setting the capacitance of the blocking capacitor 6 connected to the holder device 5 to at least 10 times that of the ion sheath, it is possible to ensure and maintain a self-bias potential at low power, even with a plasma density of the order of $10^{11}$ cm$^{-3}$.

Another embodiment of the present invention will now be described. As shown in FIG. 5, a helical wave plasma treatment apparatus of this embodiment is provided with a processing vessel 3 that is maintained at a predetermined degree of vacuum, gas supply pipes 1 for supplying a process gas G into the processing vessel 3, gas exhaust pipes 2 for exhausting gases from within the processing vessel after processing is completed, and a helical wave plasma generation device 4 that surrounds an application portion 3A forming part of the processing vessel 3. The helical wave plasma generation device 4 is configured such that a semiconductor wafer W supported on a holder device 5 is subjected to plasma treatment by a helical wave plasma. The application portion 3A of the processing vessel 3 is formed of an insulating material that is transparent to electromagnetic waves, such as quartz, and a main body 3C that is connected to a lower end aperture of the application portion 3A is formed of an electrically conductive material, such as stainless steel. The helical wave plasma generation device 4 is further configured such that it is provided with a coil-shaped antenna 4A that is arranged around the outer peripheral surface of the application portion 3A and an electromagnetic coil 4B that also surrounds the application portion, but further out from the antenna. Electromagnetic waves from the antenna 4A propagate parallel to the magnetic field shaped in the vertical direction by the electromagnetic coil 4B within the application portion 3A; the electromagnetic waves are subjected to the action of the magnetic field as they propagate through the plasma, and thus generate helical waves; and a helical wave plasma is generated as these helical waves propagate through the plasma. In FIG. 5, reference number 6 denotes a blocking capacitor and 7 denotes a radio-frequency power source. The gas supply pipes 1 and gas exhaust pipes 2 are arranged in the same manner as shown in FIGS. 1 and 2.

In the top portion of the application portion 3A of the processing vessel 3 is provided a second plasma generation device 10 that generates radio-frequency waves towards the semiconductor wafer W and increases the density of the central portion of the above helical wave plasma by the electromagnetic energy thereof. The second plasma generation device 10 is configured of a one-turn loop antenna 10A arranged around the top portion of the application portion 3A and a radio-frequency power source 10C connected to the loop antenna 10A via a matching circuit 10B.

Figure 6:
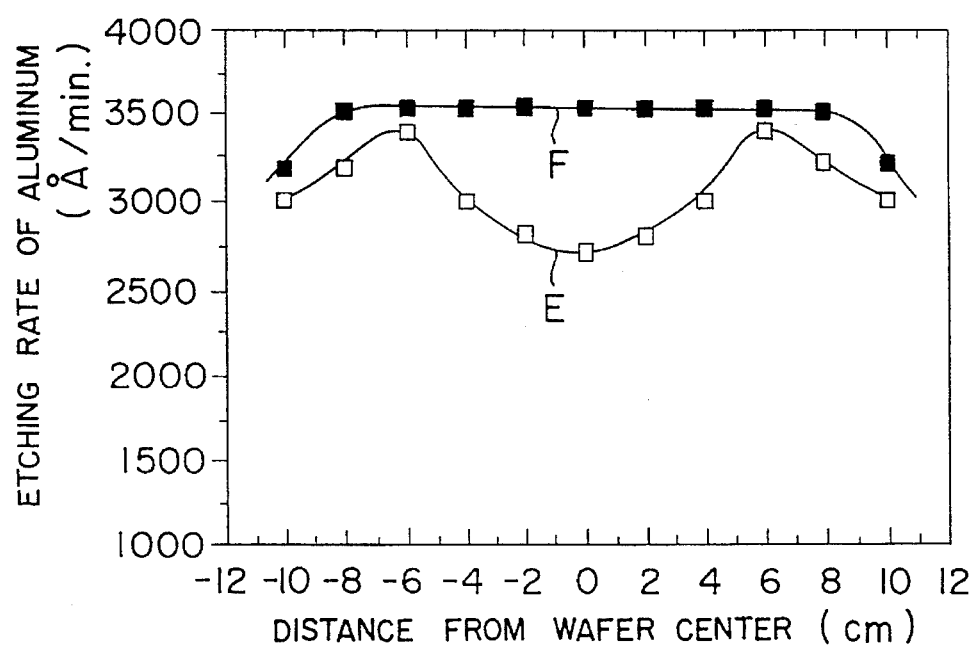
FIG. 6 is a graph comparing etching rates of the plasma treatment apparatus of FIG. 5 and a prior art plasma treatment apparatus of the same type.

During, for example, physical etching of a semiconductor wafer W using argon, the argon is first supplied from the gas supply pipes 1 and its pressure is adjusted to, for example, 10 mmTorr, with a semiconductor wafer W held on the holder device 5. In this state, if radio-frequency voltage is applied to the antenna 4A to produce electromagnetic waves propagating from the antenna 4A axially within the processing vessel 3, the argon receives activating energy from the waves and a plasma is generated. Further, parallel magnetic field produced by the electromagnetic coil 4B acts on the electromagnetic wave so that helical waves of low frequency are produced from the magnetic waves to generate a high density plasma. In this state, if the magnetic field within the processing vessel 3 is adjusted to be weak by the electromagnetic coil 4B, the plasma density at the central portion of the processing vessel 3 will be lower than that at the peripheral portions thereof, as shown by a distribution curve E in FIG. 6, and thus the etching rate will drop. However, in this embodiment, by generating radio-frequency waves from the loop antenna 10A toward the semiconductor wafer W within the main body 3C from the head portion of the application portion 3A of the processing vessel 3, the resultant electromagnetic energy increases the density of the helical wave plasma in the center portion of the processing vessel 3. This increases the etching rate at the central portion so that the semiconductor wafer W can be etched at substantially the same rate as the etching rate at the periphery, as shown by a distribution curve F in this figure, so that uniform etching (plasma processing) is implemented over the entire surface.

In accordance with this embodiment, the loop antenna 10A that increases the density of the plasma generated by radio-frequency waves directed toward the semiconductor wafer W is provided in the top portion of the application portion 3A of the processing vessel 3. Thus, since radio-frequency waves are generated from the loop antenna 10A in this portion, even if the strength of the magnetic field of the electromagnetic coil 4B is decreased with resultant lowered action of the magnetic field in the central portion of the processing vessel 3, and with resultant drop of the plasma density in that portion, the plasma density can be increased by generating a plasma by that electromagnetic energy. This enables the implementation of uniform plasma processing over the entire surface of the semiconductor wafer W and, moreover, it enables the implementation of uniform plasma treatment by reducing the effects of the magnetic field with respect to the plasma treatment, for processing a semiconductor wafer W in a low magnetic field environment. Further, even if the diameter of the semiconductor wafer W should increase, the plasma density in the central portion of the application portion 3A can be reliably increased by the loop antenna 10A to suit its surroundings.

Figure 7:
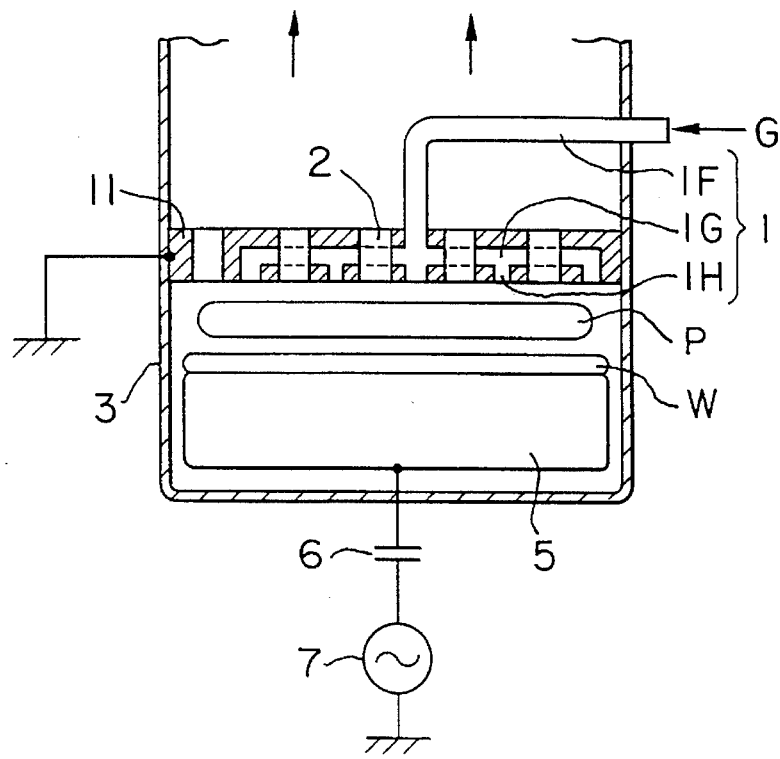
FIG. 7 is a sectional view of a central portion of a plasma treatment apparatus of a parallel flat-electrode configuration.
Figure 8:
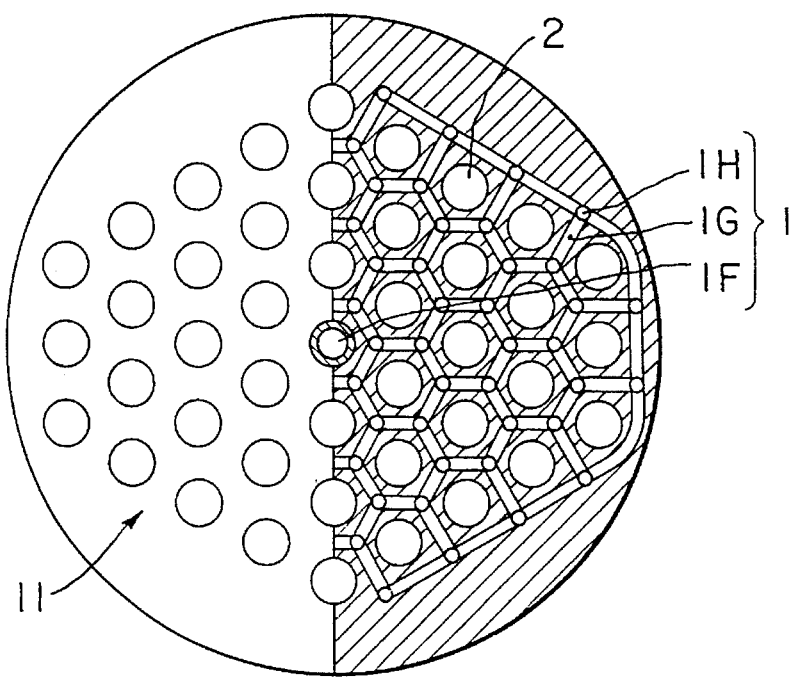
FIG. 8 is a partial cross-sectional view of an upper electrode shown in FIG. 7, with the right half in section.

A sectional view of a parallel flat-electrode type of plasma treatment apparatus is shown in FIG. 7, wherein this plasma treatment apparatus is, as shown in the figure, provided with a processing vessel 3 that is maintained at a predetermined degree of vacuum, a lower electrode 5 that is arranged at the bottom of the processing vessel 3 and also functions as a holder device, and an upper electrode 11 that is arranged facing the top of the lower electrode 5, with the configuration being such that a high-density plasma can be achieved at a comparatively low vacuum. A radio-frequency power source 7 is connected to the lower electrode via a blocking capacitor 6, and the upper electrode 11 is grounded. Therefore, the plasma treatment apparatus is configured in such a manner that the process gas G is turned into a plasma by a charge between the lower and upper electrodes 5 and 11. The upper electrode 11 is formed in a circular plate shape having a gas supply portion 1 that supplies process gas G and a gas exhaust portion 2 that exhausts the gases after the treatment. The gas supply portion 1 is configured of a gas reception supply pipe 1F connected to the center of the upper electrode 11, gas passageways 1G that communicate with the gas reception supply pipe 1F and are formed in a honeycomb structure over the entire surface of the interior, and a large number of gas supply holes 1H that open at each corner of the gas passageways 1G and are directed from the gas passageways 1G toward the lower surface of the upper electrode 11, as shown in FIG. 8. The gas exhaust portion 2 is configured of a large number of exhaust holes, each formed at the center of a honeycomb cell, as shown in FIG. 8.

During the plasma treatment, when the process gas G is supplied from the gas reception supply pipe 1F, that process gas G travels over the entire surface of the upper electrode 11 through the gas passageways 1G therein, and is supplied in a shower throughout the interior of the processing vessel 3 from the gas supply holes 1H scattered over the entire surface, and thus the concentration distribution can be made uniform within the processing vessel 3. The process gas G is turned into a plasma by the action of the charge between the lower electrode 5 and the upper electrode 11 and thus a plasma of high density is generated. Unwanted gases after the treatment is completed are exhausted as they are to the outside through the gas exhaust holes 2 scattered uniformly over the entire surface of the upper electrode 11. Thus, local pooling of gas that has been used on the semiconductor wafer W can be suppressed, so that any bad effects that the used gas might have on the plasma treatment are suppressed and uniform processing can be performed.

Figure 11:
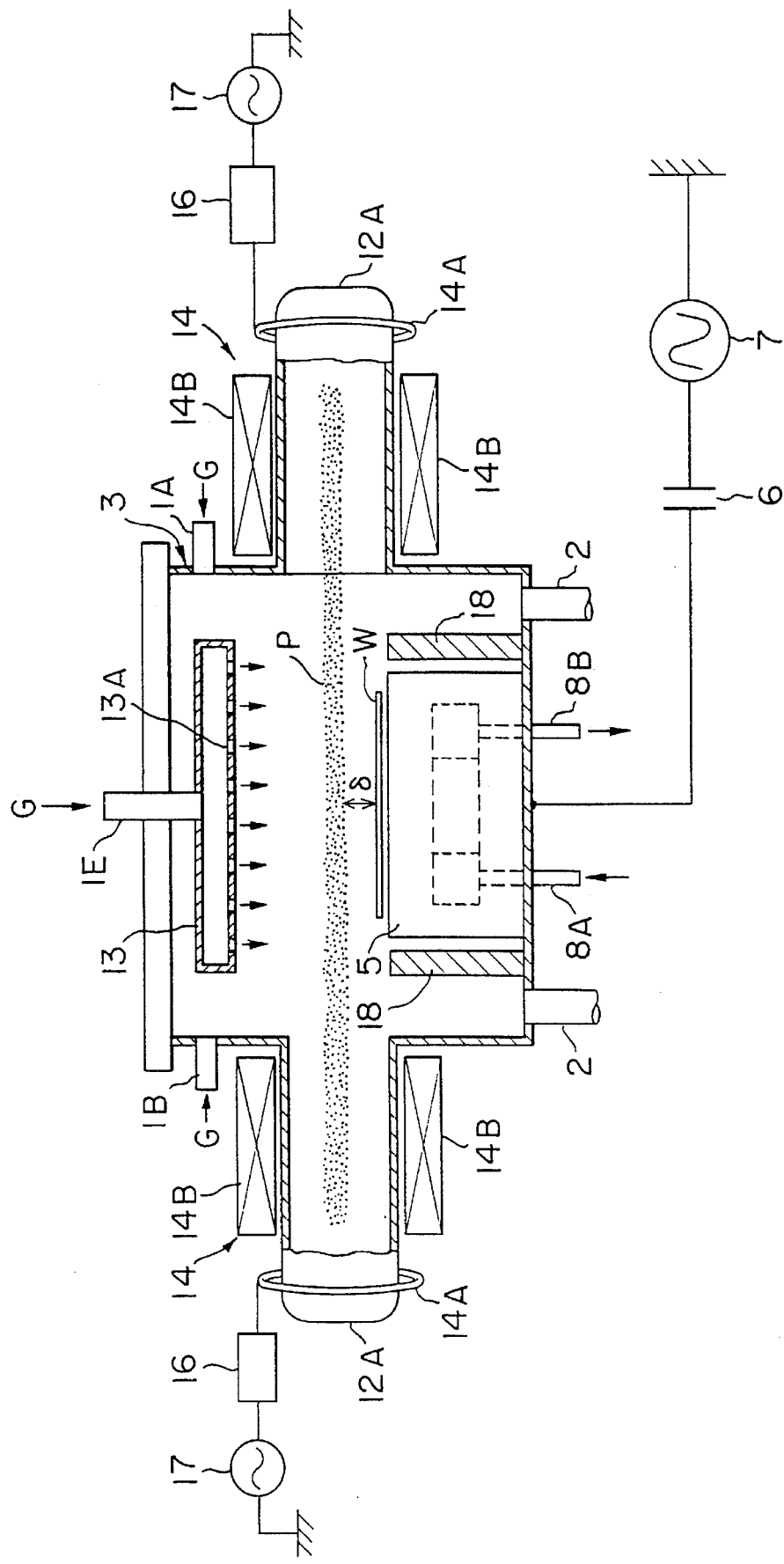
FIG. 11 is a vertical sectional view through a helical wave plasma treatment apparatus in accordance with a third embodiment of the present invention.

A plasma treatment apparatus of a further embodiment of the present invention is shown in FIG. 11. This plasma treatment apparatus, in the same manner as the embodiment shown in FIGS. 1 and 2, is provided with first process gas supply pipes 1A, 1B, 1C, and 1D (only 1A and 1B are shown in the figure) that are arranged equidistantly in the circumferential direction of an upper portion of a processing vessel 3, and a second process gas supply pipe 1E that is arranged pointing downwards at the center of the top portion of the processing vessel 3. A number of gas exhaust pipes 2, such as four (although only two can be seen in the figure), are provided equidistantly around the peripheral direction of a base portion of the processing vessel 3. A holder device 5 for holding a semiconductor wafer is also provided in the processing vessel 3, and this is connected to a coolant supply pipe 8A and a coolant exhaust pipe 8B. A radio-frequency power source 7 for applying radio-frequency voltages at, for example, 100 kHz is also connected to the holder device, with a blocking capacitor 6 therebetween.

A gas supply head 13 communicating with the second process gas supply pipe 1E is provided in an upper portion of the processing vessel 3, with a large number of process gas supply holes 13A formed therein. A pair of helical wave plasma generation devices 14 are provided on either side of the processing vessel 3. These plasma generation devices 14 act to cause the generation of a flat, plate-shaped helical wave plasma P separated from the top of the semiconductor wafer W on the holder device by a gap δ.

Figure 12:
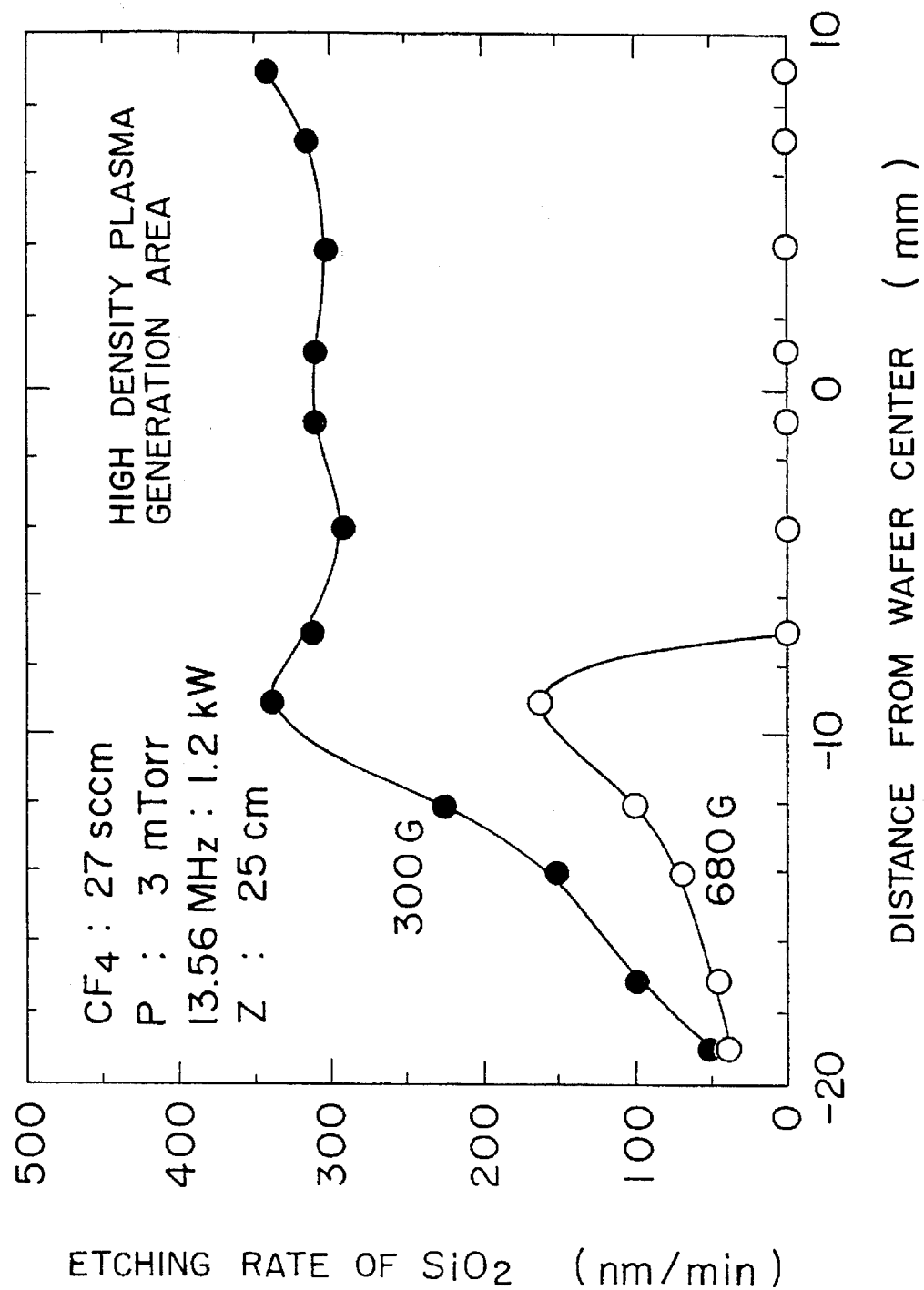
FIG. 12 is a graph of the relationship between distance from the center of the semiconductor wafer and etching rate during processing using the plasma treatment apparatus of FIG. 11.

Two cylindrical application portions 12A are attached integrally and symmetrically along the same axis on either side portion of the processing vessel 3, with the outer ends thereof closed. A loop antenna 14A is provided around each application portion 12A. These application portions 12A are formed from an insulating material that is transparent to electromagnetic waves, such as quartz. The entirity of these application portions 12A need not be formed of an insulating material such as quartz, but at least the portions thereof to which the loop antennas 14A are attached should be formed from an insulating material such as quartz. In each of the application portions 12A is arranged an electromagnetic wave dispatching means (the loop antenna) 14A and a rectangular magnetic field shaping device 14B that configures the plasma generation device 14. The axis thereof extends at a distance δ above the semiconductor wafer W. This distance δ is selected to be offset from the high-density region of the helical wave plasma P, for example, it is set to be approximately 10 mm under the conditions shown in FIG. 12. The electromagnetic wave dispatching means is configured of one-turn loop antennas 14A that were described previously. Each of these loop antennas 14A is connected to a radio-frequency power source 17 that applies a radio-frequency voltage at, for example, 13.56 MHz, with a blocking capacitor 16 therebetween, and the configuration is such that the application of this radio-frequency voltage dispatches electromagnetic waves that propagate from the loop antenna 14A parallel along the surface of the holder device 5, disassociating the process gas G, and thus causing a high-density plasma to be generated.

The above mentioned rectangular magnetic field shaping means is provided with a pair of the rectangular coils 14B that are arranged above and below the application portions 12A, with the configuration being such that a magnetic field having rectangular field surfaces in the same directions as the electromagnetic waves from above and below the application portions 12A (hereinafter referred to as "rectangular magnetic field") is formed within the application portions 12A. With this configuration, the rectangular magnetic field acts on the electromagnetic waves dispatched from the loop antennas 14A and also seals in the plasma, so that low-frequency helical waves are generated in the plasma from the electromagnetic waves. While these helical waves are propagating in the rectangular magnetic field, Landau damping occurs in the plasma and the electrons in the plasma are accelerated in the flat plate-shaped region, the impact of this energy is imparted to the process gas molecules, increasing the density of the plasma and generating the helical wave plasma P. This helical wave plasma P is formed as a high-density plasma in a thin, expansive flat plate-shaped region that is sealed off by the rectangular magnetic field. Since the helical wave plasma generation devices 14 are arranged symmetrically with respect to the processing vessel 3, an approximately even flat plate-shaped helical wave helical wave plasma P without attenuation can be formed slightly above the semiconductor wafer W in the processing vessel 3, with a gap δ between the helical wave plasma P and the semiconductor wafer W.

The second gas supply pipe 1E arranged in the upper portion of the processing vessel 3 supplies process gas G in a shower directed at the entire surface of the semiconductor wafer W, through a head 13 that has a large number of gas supply holes 13A distributed uniformly thereover, and a uniform helical wave plasma is generated from the process gas G above the semiconductor wafer W. A magnetic path 18 formed of a magnetic material is provided around the periphery of the holder device 5, a magnetic field passageway formed by this magnetic path 18 is created in the vicinity of the semiconductor wafer W, and it is configured in such a manner that the magnetic field in the vicinity of the semiconductor wafer W is decreased. This decrease in the magnetic field enables not only a uniformization of the plasma treatment of the semiconductor wafer W by reducing any uneven distribution of the plasma in the vicinity of the semiconductor wafer W. It also enables etching in a weak magnetic field.

The operation of this apparatus will now be described. First, the interior of the processing vessel 3 is placed at a predetermined degree of vacuum, with a semiconductor wafer W held on the holder device 5. Process gas G is then supplied from the gas supply pipes 1A to 1E into the processing vessel 3 that is maintained at the predetermined degree of vacuum. Then electromagnetic waves are generated from the loop antennas 14A of the helical wave plasma generation devices 14 in a direction parallel to the top surface of the holder device 5 and the process gas G is turned into a plasma by these electromagnetic waves. Since a rectangular magnetic field is being generated at the same time within the application portions 12A in the same direction (parallel direction) as the electromagnetic waves from the upper and lower rectangular coils, the plasma is sealed in by this rectangular magnetic field and the electromagnetic waves are also receiving the action of the rectangular magnetic field while they are propagating in the direction parallel to the rectangular magnetic field in this plasma, generating helical waves.

While these helical waves are propagating in the plasma of the flat plate-shaped region sealed in by the rectangular magnetic field, Landau damping occurs in the plasma, the electrons in the plasma accelerate to increase the density of the plasma, and a helical wave plasma P is generated. This helical wave plasma P generated in a flat plate-shaped region that is centered on a horizontal surface that includes the axis of the application portions 12A on the sides. Therefore, the flat plate-shaped region in which the helical wave plasma P exists is formed somewhat above the semiconductor wafer W held on the holder device 5, with the gap δ therebetween.

At the same time, since a radio-frequency voltage is applied to the holder device 5 via the blocking capacitor 6, electrons from the helical wave plasma P in the flat plate-shaped region formed thereabove are attracted to the holder device 5 preferentially, and also it becomes self-biased (minus charge) so that an ion sheath is formed between it and the helical wave plasma P. Therefore, a large potential difference occurs between the holder device 5, (that is, the semiconductor wafer W) and the helical wave plasma P, so that the ions in the helical wave plasma P collide with the semiconductor wafer W to perform the predetermined plasma processing or treatment.

During this time, the high-density region that includes many substances that could impede the plasma treatment, such as highly disassociated products or decomposed products of products caused by the plasma treatment, are sealed into the thin, expansive flat plate-shaped region formed by the rectangular magnetic field. This ensures that the plasma region that is most suitable for plasma treatment on the outer side of the high-density region (the lower surface side) is in contact with the semiconductor wafer W. Therefore, accumulation of those highly disassociated products and decomposed products on the semiconductor wafer W is suppressed, and thus the desired plasma treatment such as etching is performed reliably and rapidly. Since the helical wave plasma generation devices 14 are arranged symmetrically on either side of the processing vessel 3, the plasma density is not decreased, enabling uniform plasma treatment over the entire surface of the semiconductor wafer W.

While the process gas G is being supplied, this gas is supplied in a shower toward the semiconductor wafer W from the head 13 of the gas supply pipe 1E, so that any uneven distribution of the process gas G within the processing vessel 3 coupled with the gas supply from the peripheral gas supply pipes 1A to 1D can be suppressed and an even more uniform helical wave plasma P can be generated. Further, since reaction products generated by the plasma treatment are exhausted from the plurality of gas exhaust pipes 2 arranged equidistantly in the peripheral direction around the holder device 5, they can be exhausted both uniformly and rapidly from the vicinity of the holder device 5 from the bottom of the processing vessel 3, and thus the effects of the reaction products can be suppressed. Since the arrangement is such that the magnetic path 18 is provided around the holder device 5 and thus the magnetic field in the vicinity of the semiconductor wafer W can be reduced, unevenness due to the magnetic field of the helical wave plasma P in the vicinity of the object to be treated can be reduced to enable uniform plasma treatment and, at the same time, etching in a weak magnetic field is made possible.

The above described embodiment uses one-turn loop antennas 14A as the electromagnetic wave generation means and rectangular coils 14B as the rectangular magnetic field shaping means, but the design of the electromagnetic wave generation means and the rectangular magnetic field shaping means can be suitably modified if necessary. Similarly, the application portions 12A are not limited to being of a circular cylindrical shape, they could be formed of a prismatic, or rectangular shape; and the antennas are not limited to being of a circular shape, they could be rectangular.

In contrast, in order to achieve a high-density plasma in a prior art helical wave plasma treatment apparatus, the magnetic field strength of the coils can be raised to, for example, 680 Gauss and thus a high-density plasma of the order of $10^{13}$ cm$^{-3}$ can be achieved, but if such a high-density plasma is used for etching a semiconductor wafer, the semiconductor wafer is etched only in the peripheral portion outside the high-density region of the plasma (the region within a radius of approximately 10 mm of the center of the semiconductor wafer) and virtually no etching occurs in the central portion. Lowering the magnetic field strength from 680 Gauss will of course speed up the etching rate, and moreover delay the etching rate at positions around a radius of approximately 10 mm from the center of the semiconductor wafer, the etching rate will drop off in regions outside these positions and will tend to drop off more at the positions around a radius of approximately 10 mm, because of the high-density region in this inner region. Thus the etching rate with a prior art helical wave plasma treatment apparatus is not constant and depends on position, and there is the problem that it is not possible to uniformly etch the entire surface of the wafer, and thus there is a fear that a prior art helical wave plasma treatment apparatus will become unable to cope with the ultra-dense fabrication techniques that will be required as the diameters grow bigger.

Note that the present invention is not limited to radio-frequency induction types of plasma treatment apparatus; it can also be applied to other types of plasma treatment apparatus. It is not limited to helical wave plasma treatment apparatuses either; it can also be applied to other types of plasma treatment apparatus. Further, it can also be applied to a plasma treatment apparatus with a parallel flat-plate electrode configuration. The plasma treatment apparatus of the present invention can also be applied to other types of apparatus, such as etching apparatuses, CVD apparatuses, and ashing apparatuses.

The above described embodiment of the present invention enables the creation of a uniform high-density plasma without any drop in the plasma density in the central portion of the processing vessel, enabling uniform, rapid treatment of large-diameter objects to be processed. By simply increasing the diameter of the one-turn antennas, a large-diameter object can be subjected to uniform plasma treatment. Further, other embodiments of the present invention generate a helical wave under weak magnetic field conditions, so that a uniform high-density plasma can be created over the entire surface and thus a large-diameter object can be treated uniformly and rapidly. A self-bias potential can be ensured and maintained at a low power level, even under a high-density plasma of the order of $10^{11}$ cm$^{-3}$.

In accordance with a further embodiment of the present invention, the entire surface can be processed both uniformly and rapidly using a helical wave plasma, even when a large-diameter object is treated. Further, the object can be subjected to uniform plasma treatment without having to decrease the plasma density, and also, since a magnetic path is provided around the holder device and thus the magnetic field in the vicinity of the object is reduced, any unevenness is smoothed out by the magnetic field in the vicinity of the object so that uniform plasma processing can be performed.

What is claimed is:

1. A plasma treatment apparatus comprising:
   a processing vessel capable of being maintained at a degree of vacuum;
   gas supply means for supplying a process gas into said processing vessel;
   gas exhaust means for exhausting gases from within said processing vessel after treatment is completed;
   plasma generation means provided in said processing vessel to generate radio-frequency waves within said processing vessel to cause generation of a plasma in said process gas; and
   holder means provided in said processing vessel to hold an object to be subjected to treatment by said plasma, said object having a surface to be treated;
   said gas supply means comprising;
   a plurality of first gas supply means arranged equidistantly around a periphery of said processing vessel, said first gas supply means being provided to direct the process gas toward a center of said processing vessel and over said surface of the object; and
   second gas supply means arranged at a center of an upper portion of said processing vessel to supply the process gas toward a central portion of the processing vessel and over said surface of the object;
   said gas exhaust means comprising a plurality of gas exhaust structres arranged equidistantly around said periphery of said process vessel.

2. A plasma treatment apparatus comprising:
   a processing vessel capable of being maintained at a degree of vacuum;
   gas supply means for supplying a process gas into said processing vessel, said gas supply means including a plurality of first gas supply means arranged equidistantly around a periphery of said processing vessel, and second gas supply means arranged at a center of aun upper portion of said processing vessel;
   gas exhaust means for exhausting gases from within said processing vessel after treatment is completed, said gas exhaust means including a plurality of gas exhaust structures arranged equidistantly around said periphery of said processinmg vessel;
   plasma generation means provided in said processing vessel to generate radio-frequency waves within said processing vessel to cause generation of a plasma in said process gas, said plasma generation means comprising a one-turn loop antenna having an outer diameter greater than that of an object to be treated; and
   holder means provided in said processing vessel to hold said object to be subjected to treatment by said plasma.

3. A plasma treatment apparatus in accordance with claim 1, wherein said first gas supply means is positioned higher than said gas exhaust structures and is positioned between two neighboring gas exhaust structures with respect to the perimeter of said processing vessel.

4. A plasma treatment apparatus in accordance with claim 1, further comprising a capacitor for maintaining a bias potential of said holder means, said capacitor having a capacitance at least 10 times that of an ion sheath formed in the vicinity of said holder means.

5. A plasma treatment apparatus in accordance with claim 4, wherein the capacitance of said capacitor is at least 50 times that of said ion sheath.

6. A plasma treatment apparatus in accordance with claim 4, wherein the capacitance of said capacitor is at least 50 times that of said ion sheath.

7. A plasma treatment apparatus comprising:
   a processing vessel capable of being maintaind at a degree of vacuum;
   gas supply means for supplying a process gas into said processing vessel;
   gas exhaust means for exhausting gases from within said processing vessel after treatment is completed;
   application means provided in an upper portion of said processing vessel;
   helical wave plasma generation means provided surrounding said application means and causing generation of a helical wave plasma; and
   second plasma generation means provided above said application means, to generate radio-frequency waves and direct them toward an interior of said application means and thus increase the density of said plasma.

8. A plasma treatment apparatus in accordance with claim 7, wherein said second plasma generation means comprises a loop antenna, a radio-frequency power source, and matching means inserted between said loop antenna and said radio-frequency power source.

9. A plasma treatment apparatus in accordance with claim 7, wherein said gas supply means comprises a plurality of first gas supply means arranged equidistantly around a periphery of said processing vessel and second gas supply means arranged at a center of an upper surface of said processing vessel, and wherein
   said gas exhaust means comprises a plurality of gas exhaust structures arranged equidistantly around periphery of said processing vessel.

10. A plasma treatment apparatus comprising:
    a processing vessel capable of being maintained at a degree of vacuum;
    gas supply means for supplying a process gas into said processing vessel;
    gas exhaust means for exhausting gases from within said processing vessel after treatment is completed;
    holder means for holding an object to be treated in said processing vessel; and
    helical plasma generation means provided in a side portion of said processing vessel, to cause a helical wave plasma to be generated within said process gas in a flat-plate-shaped region interposed within a gap proximal to an object that is held on said holder means;

said helical plasma generation means comprising:

electromagnetic wave generation mean for generating electromagnetic waves parallel to said object on said holder means; and rectangular magnetic field shaping means for shaping a rectangular magnetic field in a same direction as electromagnetic waves from said electromagnetic wave generation means to cause generation of said helical wave plasma from said electrogmagnetic waves.

11. A plasma treatment apparatus in accordance with claim 10, wherein said helical plasma generation means comprises a pair of means arranged symmetrically on sides of said facing toward said processing vessel.

12. A plasma treatment apparatus in accordance with claim 10, wherein said gas supply means comprises a plurality of scattered gas supply holes in a gas supply head, said gas supply head being positioned above said holder means for supplying said process gas in a direction toward said holder means.

13. A plasma treatment apparatus in accordance with claim 10, further comprising a magnetic path provided around the periphery of said holder means for reducing the magnetic field in the vicinity of said object.

14. A plasma treatment apparatus in accordance with claim 10, wherein said gas supply means comprises a plurality of first gas supply means arranged equidistantly around a periphery of said processing vessel, and second gas supply means provided at a center of an upper portion of said processing vessel, and wherein said gas exhaust means comprises a plurality of gas exhaust structure arranged around a periphery of said processing vessel.

15. A plasma treatment apparatus comprising:

a processing vessel capable of being maintained at a degree of vacuum;

gas supply means for supplying a process gas into said processing vessel;

gas exhaust means exhausting gases from within said processing vessel after treatment is completed;

plasma generation means provided in said processing vessel to generate radio-frequency waves within said processing vessel to cause generation of a plasma; and holding means provided in said processing vessel to hold an object to be subjected to treatment by said plasma, said object having a surface to be treated;

said gas supply means comprising:

a plurality of first gas supply means arranged equidistantly around said processing vessel to supply the process gas toward a central portion within the processing vessel and over said surface of the object; and second gas supply means arranged at an upper portion of said processing vessel to supply the process gas downward toward a central portion of the processing vessel and over said surface of the objecgt;

said gas exhaust means comprising a pluraity of gas exhaust structures arranged equidxistantly in the peripheral direction around said processing vessel.

16. A plasma treatment apparatus comprising:

a processing vessel capable of being maintained at a degree of vacuum;

gas supply means for supplying a process gas into said processing vessel;

gas exhaust means for exhausting gases from within said processing vessel after treatment is completed;

plasma generation means provided in said processing vessel to generate radio-frequency waves within said processing vessel to cause generation of a plasma, said plasma generation means comprising a one-turn loop antenna having an outer diameter greater than that of an object to be treated; and holding means provided in said processing vessel to hold said object to be subjected to treatment by said plasma;

said gas supply means comprising:

a plurailty of first gas supply means arranged equidistantly aroun said processing vessel to supply the process gas toward a central portion within the processing vesse; and second gas supply means arranged at an upper portion of said processing vessel to supply the process gas downward toward a central portion of the processing vessel;

said gas exhaust means comprising a plurality of gas exhaust structures arranged equidistantly in the peripheral direction around said processing vessel.

17. A plasma treatment apparatus in accordance with claim 15, wherein said first gas supply means is positioned higher than said gas exhaust structures and is positioned between two neighboring gas exhaust structures with respect to the perimeter of said processing vessel.

18. A plasma treatment apparatus in accordance with claim 15, further comprising a capacitor for maintianing a bias potential of said holding means, said capacitor having a capacitance at least 10 times that of an ion sheath formed in the vicinity of said holding means.

19. A plasma treatment apparatus in accordance with claim 15, wherein the capacitance of said capacitance is at least 50 times that of said ion sheath.

20. A plasma treatment apparatus in accordance with claim 15, wherein the capacitance of said capacitor is at least 100 times that of said ion sheath.

* * * * *